United States Patent [19]

Szczyrbowski et al.

[11] Patent Number: 5,718,815
[45] Date of Patent: Feb. 17, 1998

[54] APPARATUS FOR COATING A SUBSTRATE FROM AN ELECTRICALLY CONDUCTIVE TARGET

[75] Inventors: Joachim Szczyrbowski, Goldbach; Götz Teschner, Hanau; Günter Bräuer, Freigericht-Altenmittlau, all of Germany

[73] Assignee: Balzers Und Leybold Deutschland Holding AG, Hanau am Main, Germany

[21] Appl. No.: 711,885

[22] Filed: Sep. 12, 1996

[30] Foreign Application Priority Data

Nov. 2, 1995 [DE] Germany ............... 195 40 794.6

[51] Int. Cl.[6] ............................................. C23C 14/36
[52] U.S. Cl. ...................... 204/298.06; 204/298.07; 204/298.08; 204/298.11; 204/298.19; 204/298.26
[58] Field of Search ............ 204/298.06, 298.07, 204/298.08, 298.11, 298.14, 298.15, 298.19, 298.26

[56] References Cited

U.S. PATENT DOCUMENTS

| | | | |
|---|---|---|---|
| 4,956,070 | 9/1990 | Nakoda et al. | 204/298.18 |
| 5,399,252 | 3/1995 | Scherer et al. | 204/298.19 |
| 5,415,757 | 5/1995 | Szcyrbowski et al. | 204/298.08 |

FOREIGN PATENT DOCUMENTS

| | | |
|---|---|---|
| 0197770 | 10/1986 | European Pat. Off. . |
| 197770 | 10/1986 | European Pat. Off. . |
| 328076 | 8/1989 | European Pat. Off. . |
| 4120690 | 12/1992 | Germany . |
| 4326100 | 2/1995 | Germany . |
| 1-158644 | 6/1989 | Japan . |
| 2-173260 | 7/1990 | Japan . |

OTHER PUBLICATIONS

Tisone & Bindell, "Low Voltage triode sputtering with a confined plasma" J. Vac. Sci. Tedin, vol. 11, pp. 519–527 (1974).

Schiller, "Hochrate–Sputtertechnik undderen Einsatz in verschiedenen Industriezweigen" Vacuum Technick 37.Jg., H. Jun. 1988, 162–175.

Schiller, "Verfahren und Einsatzmoglichkeiten des Plasmatron–Hochrate zerstoubens" Vacuum Technik 30Jg., H.Jul./1988, 195–207.

Kienel, "Moderne Beschichtungstechnologien von Architektarglas" Vacuum Technik 30 Jg. H.Aug./1981, 236–245.

Primary Examiner—R. Bruce Breneman
Assistant Examiner—Rodney G. McDonald
Attorney, Agent, or Firm—Felfe & Lynch

[57] ABSTRACT

A vacuum chamber includes a central compartment (1) in which a diode cathode (6) carrying an electrically conductive sputtering target (7) is located, and two outer compartments (11, 12) in which magnetron cathodes (13, 14) carrying target 15, 16) are located, the magnetron cathodes (13, 14) being connected to respective poles (20, 21) of an AC power source. The outer compartments (11, 12) are separated from the central compartment by walls having openings (33, 34) which flank a space (28) between the sputtering target (6) and the substrate (3). Process gas lines 24, 25) are arranged to introduce process gas into this space (3).

6 Claims, 3 Drawing Sheets

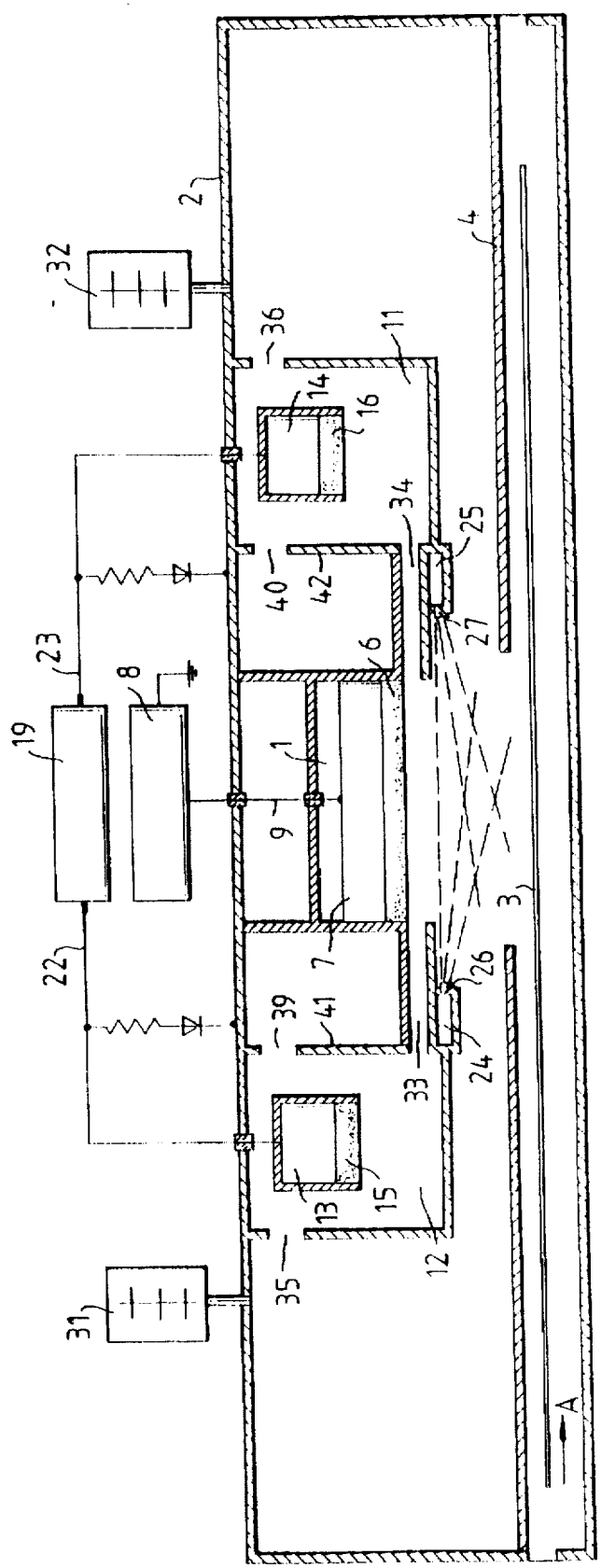

APPARATUS FOR COATING A SUBSTRATE FROM AN ELECTRICALLY CONDUCTIVE TARGET

BACKGROUND OF THE INVENTION

The invention pertains to a device for coating a substrate from an electrically conductive target, comprising a source of alternating current connected to two magnetron cathode which work electrically with the targets, where one pole of the a.c. source is connected to one of the cathodes and the other pole is connected to the other cathode by way of supply lines.

A sputtering apparatus which is referred to as a "triode" apparatus is known (T. C. Tisone and J. B. Bindell: Low-voltage triode sputtering with a confined plasma, J. of Vacuum Science and Technology, Vol. 11, pp. 519–527, 1974), in which the plasma in front of the target to be sputtered is intensified by the use of an additional low-voltage gas discharge with a thermal cathode as the electron source. The electrons in this case flow transversely through the main discharge plasma, as a result of which the charge carrier density is increased and the ionization of the gas is intensified. This known apparatus suffers from the disadvantage, however, that the possible current density is limited and especially from the disadvantage that the long-term stability is poor.

DD 252 205 discloses a sputtering apparatus for the production of thin layers is also known including a system of magnets and at least two electrodes mounted above them carrying of the material to be sputtered. The electrodes are designed electrically in such a way that they alternate between being the cathode and the anode of a gas discharge. For this purpose, the electrodes are connected to a source of sine-wave voltage of preferably 50 Hz.

This known sputtering apparatus is said to be especially suitable for the deposition of dielectric layers by reactive sputtering. The goal of operating the apparatus at about 50 Hz is to prevent the development of "flutter" at the anode and also to prevent electrical short-circuits (so-called arcs) when coating is being carried out with metal.

U.S. Pat. No. 4,956,070 discloses an apparatus for depositing a thin film by sputtering, in which the rate at which the layers of different materials are deposited can be controlled so that extremely thin layer packages can be produced. At least two different types of counterelectrodes are provided on the cathode side.

DE 35 41 621 discloses an apparatus for the deposition of a metal alloy by means of HF sputtering is also known, in which two targets are driven in alternation. The targets contain the metal components of the metal alloy to be deposited but in different proportions. The substrates are for this purpose mounted on a substrate carrier, which is rotated by a drive unit during the sputtering process.

DE 38 02 852 also discloses an apparatus for the coating of a substrate with two electrodes and at least one material to be sputtered, wherein the alternating current half-waves are selected to have essentially the same amplitudes. The substrate to be coated is mounted between and a certain distance away from the two electrodes.

DE 41 06 770 discloses reactive coating of a substrate with an electrically insulating material such as silicon dioxide ($SiO_2$). The apparatus consists of a source of alternating current, which is connected to cathodes. The cathodes enclose magnets and are mounted in a coating chamber. The cathodes work together with targets, and each of the two ungrounded outputs of the a.c. power source is connected to one of the cathodes carrying one of the targets. The two cathodes are installed next to each other in the coating chamber in a plasma space and each of them is approximately the same distance away from the substrate facing it. The effective value of the discharge voltage is measured by a voltage effective value measuring device connected by a line to the cathode, and the signal is sent as a direct voltage over a line to a controller. The controller drives a control valve in such a way as to adjust the flow rate of reactive gas from the tank into the distribution line so that the measured voltage agrees with the desired voltage.

U.S. Pat. No. 5,415,757 discloses an apparatus for coating a substrate especially with nonconductive layers from electrically conductive targets in a reactive atmosphere. A current source is connected to cathodes which enclose magnets and are installed in an evacuatable coating chamber. The cathodes work together electrically with the targets. Two anodes, separated electrically from each other and from the sputtering chamber, are installed on a plane between the cathodes and the substrate. Each of the two outputs of the secondary winding of a transformer connected to a medium-frequency generator is connected to one of the cathodes by way of a power supply line. The first and second supply lines are connected to each other by a branch line, into which an oscillatory circuit, preferably a coil and a capacitor, is inserted. Each of the two supply lines is connected to the coating chamber by way of a first electric element, which adjusts the direct voltage potential with respect to ground; to the associated anode by way of a corresponding second electric element; and also to the coating chamber by way of a branch line with an inserted capacitor. A choke coil is inserted into the section of the first supply line which connects the oscillatory circuit to the second terminal of the secondary.

SUMMARY OF THE INVENTION

Whereas the known devices deal with the problem of arcing, that is, with the problem of preventing the formation of undesirable electric arcs and of protecting the surface of the target from the formation of insulating layers, the object of the present invention is to ensure not only the long-term stability and the deposition rate of the sputtering process but also to guarantee a high degree of target utilization and uniformity.

According to the present invention, each cathode is installed in its own compartment inside the vacuum chamber, and each of these compartments is connected to a third centrally located compartment by openings in partition walls. A diode cathode with the sputtering target is provided in the third compartment and is connected by a line to its own source of direct current. Gas lines lead to the space between the diode cathode and the substrate facing it, so that the process gas can be introduced into this area between the target of the diode cathode and the substrate.

BRIEF DESCRIPTION OF THE DRAWING

FIG. 3 is a schematic section of a third embodiment.

DETAILED DESCRIPTION OF THE PREFERRED EMBODIMENTS

Figure 1:
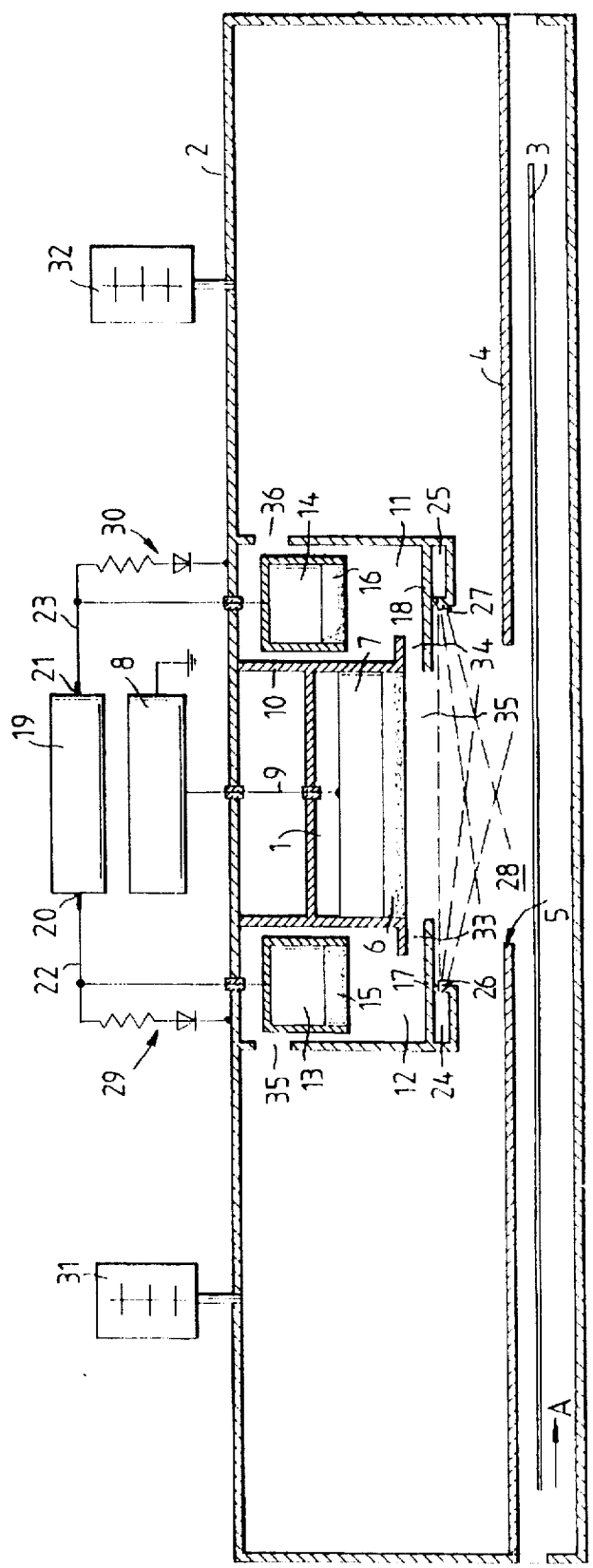
FIG. 1 is a schematic section of a first embodiment.

The apparatus shown in FIG. 1 consists of a vacuum chamber 2, in which substrate 3, which can move in the longitudinal direction, is mounted and guided. Above substrate 3 there is a diaphragm 4 with a diaphragm orifice 5, which allows the material sputtered from target 6 of cathode 7 to be deposited onto the surface of substrate 3, which is moving in the direction of arrow A. Cathode 7 is connected by a line 9 to a source of direct current 8 and is separated otherwise by means of a cup-shaped housing 10 from compartments 11, 12, in which magnetron cathodes 13, 14 are installed, the targets 15, 16 of which are directed toward lower wall sections 17, 18 of compartments 11, 12. Cathodes 13, 14 are connected by current conductors 22, 23 to poles 20, 21 of a.c. current source 19. Underneath floor sections 17, 18 of compartments 11, 12 are gas feed lines 24, 25 with nozzles 26, 27, through which process gas flows into intermediate space 28, which is bounded by target 6 on one side and by substrate 3 on the other.

It should also be mentioned that, to help with the ignition, electric current conductors 22, 23 are connected by resistors 29 and diodes 30 to vacuum chamber 2, and vacuum chamber 2 is also connected to vacuum pumps 31, 32; and that, in the plane of target 6 of diode cathode 7, openings 33, 34 are provided, which connect compartments 11, 12 to space 35 directly in front of target 6, so that the plasma generated by magnetron cathodes 13, 14 burns uniformly in front of the target of the diode cathode (the cathode without an arrangement of magnets) 7 in space 35. Additional openings 35, 36 in the outside walls of the compartments 11, 12 make it possible to evacuate these compartments quickly.

Figure 2:
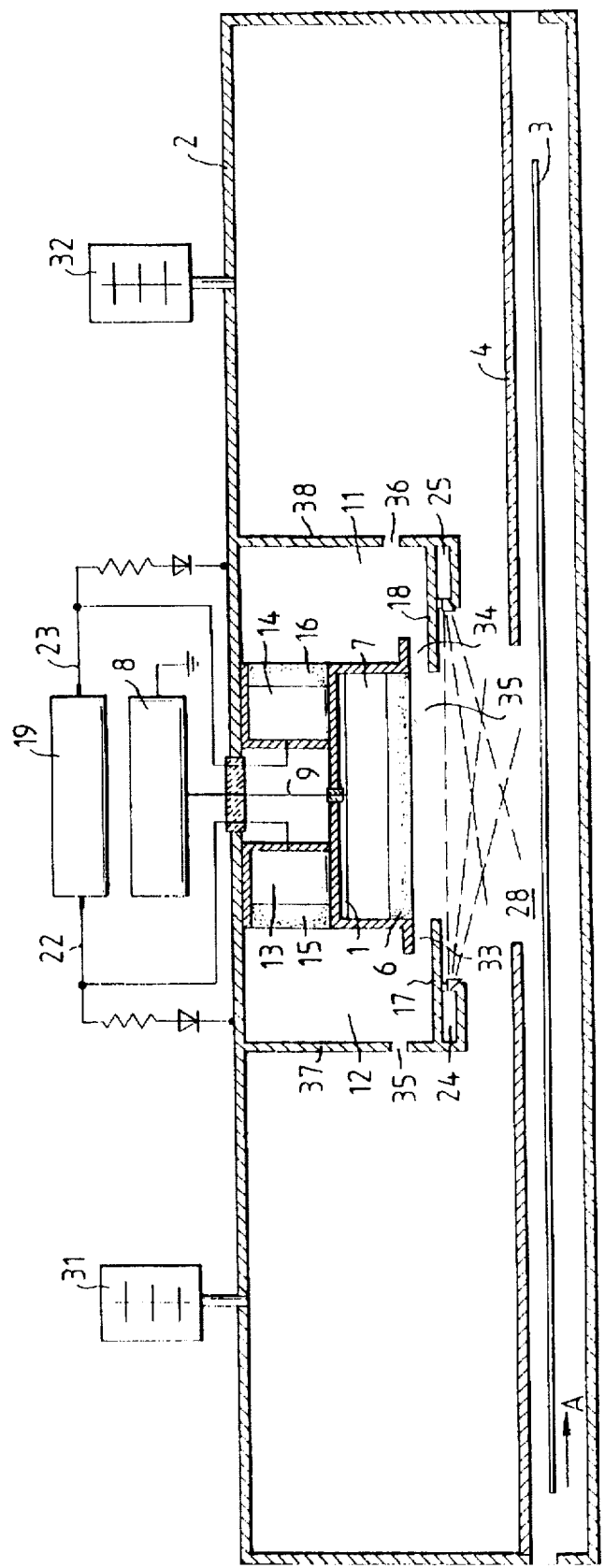
FIG. 2 is a schematic section of a second embodiment.

The embodiment according to FIG. 2 differs from that according to FIG. 1 in that magnetron cathodes 13, 14 are installed in such a way that their targets 15, 16 face outside walls 37, 38 of compartments 11, 12.

The embodiment according to FIG. 3 differs from that according to FIG. 1 essentially in that compartments 11, 12 are connected to each other by rear openings or channels 39, 40 in walls 41, 42, which face each other.

An advantage which the apparatus according to the invention offers over known apparatuses is that, by the use of magnetron cathodes which have been moved away from each other as an additional plasma source (electrons and ions), the plasma density directly in front of the diode cathode mentioned is much higher than that in known apparatuses. Thus the following goals are achieved:

1. higher deposition rate;
2. good uniformity;
3. high target utilization;
4. high long-term stability; and
5. static sputtering with good uniformity over a wide area.

"TwinMag" cathodes 13, 14 (assembly consisting of two magnetron cathodes) are equipped with targets 15, 16 of carbon to obtain the lowest possible sputtering rate, because, in this apparatus the sputtering effect of the magnetron discharge is undesirable. Diode cathode 7 is covered by a target 6, which contains the material to be sputtered. All three cathodes are located in a vacuum chamber 2. Each of the three cathodes has dark space shielding. The dark space shielding of the TwinMag cathodes is floating, whereas the dark space shielding of the diode cathode is grounded. Diode cathode 7 is connected to a direct voltage power supply, where the positive pole of the power supply is connected to the vacuum chamber, that is, grounded. The alternating voltage (the a.c. voltage of the main power grid or a medium frequency or a frequency in between) is applied to the two TwinMag cathodes 13, 14. As a result of the alternating voltage, a plasma band develops between the two cathodes 13, 14. The spread of the plasma band is limited by the shielding of the assembly, so that the plasma band passes over the target of the diode cathode. The gas manifold including lines 24, 25 and nozzles 26, 27 is located underneath the lower wall sections 17, 18, so that the targets cannot be struck directly by a jet of gas.

We claim:

1. Apparatus for coating a substrate, said apparatus comprising a vacuum chamber comprising a central compartment and two outer compartments separated from said central compartment by two respective walls, a magnetron cathode located in each of said outer compartments, each magnetron cathode carrying a target, an AC power source having one pole connected to each of said magnetron cathodes, a diode cathode carrying a sputtering target in said central compartment, means for holding a substrate opposite said sputtering target, thereby defining a space between said sputtering target and said substrate, an opening connecting each said outer compartment to said space, and means for introducing a process gas into said space.

2. Apparatus as in claim 1 wherein said openings flank said space between said sputtering target and said substrate.

3. Apparatus as in claim 1 wherein said targets carried by said magnetron cathodes face outwardly from said central compartment and oppositely from each other.

4. Apparatus as in claim 1 wherein said targets carried by said magnetron cathode face in the same direction as said sputtering target.

5. Apparatus as in claim 1 wherein said sputtering target is an electrically conductive material.

6. Apparatus as in claim 1 wherein said targets carried by said magnetron cathodes are made of carbon.

\* \* \* \* \*

UNITED STATES PATENT AND TRADEMARK OFFICE
CERTIFICATE OF CORRECTION

PATENT NO. : 5,718,815

DATED : February 17, 1998

INVENTOR(S) : SZCZYRBOWSKI et al.

It is certified that error appears in the above-identified patent and that said Letters Patent is hereby corrected as shown below:

On the title page: Item [56]
in the section titled References Cited, under Other Publications, line 11, change "Architektarglas" to -- Architekturglas --.

In the Abstract, line 5, change "target 15, 16)" to -- targets (15, 16) --.

In Claim 1, column 4, line 35, between the words "said" and "sputtering" insert the phrase -- diode cathode carrying said --.

In Claim 1, column 4, line 36, between the words "said" and "sputtering" insert the phrase -- diode cathode carrying said --.

In Claim 1, column 4, line 38, delete the phrase "an opening connecting each said outer compartment" and replace with -- said walls having openings connecting each of said outer compartments --.

UNITED STATES PATENT AND TRADEMARK OFFICE
CERTIFICATE OF CORRECTION

PATENT NO. : 5,718,815

DATED : February 17, 1998

INVENTOR(S) : SZCZYRBOWSKI et al.

It is certified that error appears in the above-identified patent and that said Letters Patent is hereby corrected as shown below:

On the title page: Item [56]

in the section titled References Cited, under U.S. Patent Documents, line 1, change "Nakoda" to -- Nakada --.

in the section titled References Cited, under U.S. Patent Documents, line 3, change "Szcyrbowski" to -- Szczyrbowski --.

in the section titled References Cited, under Foreign Patent Documents delete the first line, which is a repetition of the second line.

in the section titled References Cited, under Other Publications, line 2, change "Tedin." to -- Techn. --.

in the section titled References Cited, under Other Publications, line 8, change "zerstoubens" to -- zersteubens --.

Signed and Sealed this

Fourteenth Day of September, 1999

Attest:

Q. TODD DICKINSON

*Attesting Officer*     *Acting Commissioner of Patents and Trademarks*